United States Patent
Oh et al.

(10) Patent No.: US 8,526,707 B2
(45) Date of Patent: Sep. 3, 2013

(54) METHOD OF INSPECTING A MASK

(75) Inventors: Yoonna Oh, Seongnam-si (KR); Jae-Pil Shin, Suwon-si (KR); Jin Choi, Seoul (KR); Moon-Hyun Yoo, Hwaseong-si (KR); Jong-Bae Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 399 days.

(21) Appl. No.: 12/968,725

(22) Filed: Dec. 15, 2010

(65) Prior Publication Data
US 2011/0142325 A1  Jun. 16, 2011

(30) Foreign Application Priority Data
Dec. 16, 2009 (KR) .......................... 10-2009-125341

(51) Int. Cl.
*G06K 9/00* (2006.01)

(52) U.S. Cl.
USPC ............................ 382/144; 382/145; 382/147

(58) Field of Classification Search
USPC ................... 382/144, 145, 147; 438/16, 401, 438/462, 800; 716/2, 19, 20, 21; 356/237.4, 356/237.5, 394; 430/4, 5, 30; 700/96, 97, 700/105, 120, 121; 348/86, 87, 125, 126; 250/200, 559.3, 559.37, 559.44
See application file for complete search history.

(56) References Cited

U.S. PATENT DOCUMENTS

| | | |
|---|---|---|
| 7,266,232 B2 * | 9/2007 | Asai et al. ...................... 382/141 |
| 2004/0057611 A1 * | 3/2004 | Lee et al. ...................... 382/145 |
| 2009/0208090 A1 | 8/2009 | Nishiura et al. |

FOREIGN PATENT DOCUMENTS

| | | |
|---|---|---|
| KR | 100677995 B1 | 1/2007 |
| KR | 1020080018415 A | 2/2008 |

\* cited by examiner

*Primary Examiner* — Brian Le
(74) *Attorney, Agent, or Firm* — Myers Bigel Sibley & Sajovec, P.A.

(57) ABSTRACT

In a method of inspecting a mask, an image of a pattern on the mask may be obtained. A histogram of the image by grey levels may be obtained. The histogram may be compared with information of the pattern to detect a defect of the mask. Thus, reliability of defect detection in the mask may be remarkably improved.

4 Claims, 5 Drawing Sheets

METHOD OF INSPECTING A MASK

CROSS-RELATED APPLICATION

This application claims priority under 35 USC §119 to Korean Patent Application No. 2009-125341, filed on Dec. 16, 2009 in the Korean Intellectual Property Office (KIPO), the contents of which are herein incorporated by reference in their entirety.

BACKGROUND

1. Field

Example embodiments relate to a method of inspecting a mask and an apparatus for performing the same. More particularly, example embodiments relate to a method of inspecting a mask that may be used for forming a photoresist pattern on a semiconductor substrate, and an apparatus for performing the method.

2. Description of the Related Art

Generally, a photolithography process may be performed on a semiconductor substrate to form a pattern on the semiconductor substrate. For example, a layer may be formed on the semiconductor substrate. A photoresist film may be formed on the layer. A mask having a mask pattern may be arranged over the photoresist film. A light may be irradiated to the photoresist film through the mask to transcribe the mask pattern into the photoresist film. The photoresist film may be developed to form a photoresist pattern having a shape corresponding to the mask pattern. The layer may be etched using the photoresist pattern as an etch mask to form the pattern on the semiconductor substrate.

Because the pattern may have a shape corresponding to the mask pattern, it may be important to provide the mask pattern with a designed shape. The mask pattern may be obtained by forming a light-blocking layer on a mask substrate, and exposing the light-blocking layer using an electron beam.

Thus, whether the mask pattern may be normal or not may be determined in accordance with an electron beam irradiating apparatus for irradiating the electron beam to the light-blocking layer. As a result, a process for testing the electron beam irradiating apparatus may be performed.

According to a conventional method of inspecting a mask, an actual image, which may be obtained from a mask pattern formed by the electron beam irradiating apparatus, may be compared with a reference image to determine whether the mask pattern may be normal or not.

However, the conventional method using comparing the actual image with the reference image may have problems in view of determination accuracy. For example, a set of the reference image may have low reliability. Further, there may exist errors in an allowable range, which may be used for determining whether the actual image may be normal or not, set from the reference image.

SUMMARY

Example embodiments provide a method of inspecting a mask that may be accurately detect defects of an electron beam irradiating apparatus.

Example embodiments also provide an apparatus for performing the above-mentioned method.

According to some example embodiments, there is provided a method of inspecting a mask. In the method of inspecting the mask, an image of a pattern on the mask may be obtained. A histogram of the image by grey levels may be obtained. The histogram may be compared with information of the pattern to detect a defect of the mask.

In some example embodiments, the method may further include removing noises of the image. Removing the noises may include smoothing the image, and binarizing the smoothed image.

In some example embodiments, the pattern may have a lattice-like shape. Obtaining the histogram may include measuring first grey levels of the lattice pattern along an X-direction, and measuring second grey levels of the lattice pattern along a Y-direction. Comparing the histogram with the information may include determining a portion of the histogram discrepant with the information as a bridge of the pattern.

In some example embodiments, the pattern may have a linear shape. Obtaining the histogram may include measuring grey levels of the linear pattern along a lengthwise direction of the linear pattern, and measuring widths of the grey levels. Comparing the histogram with the information may include determining a portion of the histogram discrepant with the information as a shifted portion of the pattern. Additionally, the method may further include measuring a width of the linear pattern, and determining a portion of the pattern having a width of the measured widths beyond an allowable range as a partially shifted portion of the pattern.

According to some example embodiments, there is provided an apparatus for inspecting a mask. The apparatus may include an image-obtaining unit, a measuring unit and a determining unit. The image-obtaining unit may obtain an image of a pattern on the mask. The measuring unit may measure grey levels of the image to obtain a histogram. The determining unit may compare the histogram with information of the pattern to detect a defect of the mask.

In some example embodiments, the apparatus may further include a noise-removing unit for removing noises of the image.

According to some example embodiments, the defects such as the bridge or the shift may be detected using the histogram obtained from the image of the pattern on the mask. Thus, reliability of defect detection in the mask may be remarkably improved. As a result, defects of an electron beam irradiating apparatus used for manufacturing the mask may be accurately detected.

BRIEF DESCRIPTION OF THE DRAWINGS

Example embodiments will be more clearly understood from the following detailed description taken in conjunction with the accompanying drawings.

FIG. 1 is a block diagram illustrating an apparatus for inspecting a mask in accordance with some example embodiments;

FIG. 2 is a flow chart illustrating a method of inspecting a lattice mask pattern using the apparatus in FIG. 1;

FIG. 3 is an image of the lattice mask pattern obtained using an image-obtaining unit of the apparatus in FIG. 1;

FIG. 4 is a histogram obtained from the image in FIG. 3;

FIG. 5 is a flow chart illustrating a method of inspecting a linear mask pattern using the apparatus in FIG. 1;

FIG. 6 is an image of the linear mask pattern obtained using the image-obtaining unit of the apparatus in FIG. 1.

DETAILED DESCRIPTION OF THE EMBODIMENTS

Figure 1:
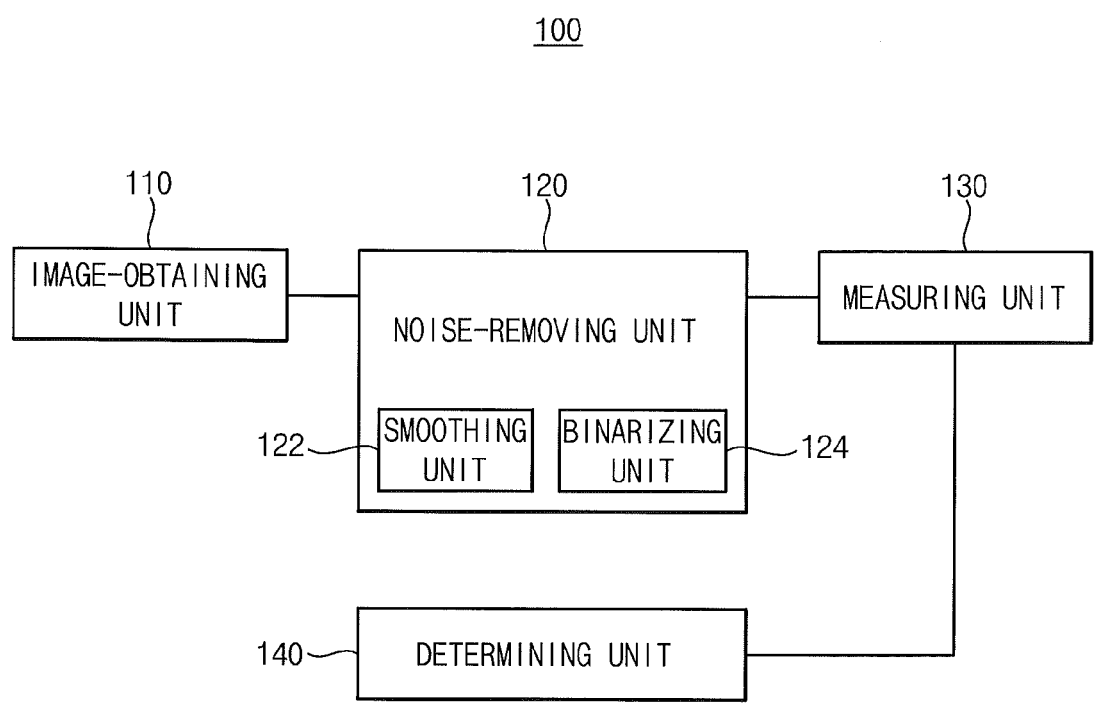
FIGS. 1 to 6 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Apparatus for Inspecting a Mask

FIG. 1 is a block diagram illustrating an apparatus for inspecting a mask in accordance with some example embodiments.

Referring to FIG. 1, an apparatus 100 for inspecting a mask in accordance with this example embodiment may include an image-obtaining unit 110, a noise-removing unit 120, a measuring unit 130 and a determining unit 140.

The image-obtaining unit 110 may obtain an image of a mask pattern on the mask. In some example embodiments, the image-obtaining unit 110 may include a scanning electron microscope (SEM) equipment for obtaining an SEM picture. The mask pattern may include a lattice-like shape, a linear shape, etc. The mask pattern may include an actual pattern for forming a photoresist pattern or a test pattern for determining whether the mask may be normal or not.

The noise-removing unit 120 may remove noises of the image obtained by the image-obtaining unit 110. In some example embodiments, the noise-removing unit 120 may include a smoothing unit 122 and a binarizing unit 124.

The smoothing unit 122 may remove the noises in the image. In some example embodiments, the smoothing may be referred to remove the noises using a general image processing technique.

The binarizing unit 124 may process the image without the noises to obtain a second image having a black color and a white color. In some example embodiments, the binarization may be referred to convert brightness of each of pixels in the binarized image into the black color and the white color with respect to reference brightness.

The measuring unit 130 may measure numbers of white pixels in the binarized image along an X-direction and a Y-direction to obtain a histogram of the image. A black portion on the image may be represented as a low value on the histogram. In contrast, a white portion on the image may be represented as a high value, i.e., a peak on the histogram.

For example, when the mask pattern may include the lattice pattern, a portion in the lattice pattern may be white, so that the lines in the lattice pattern may be represented as the peak on the histogram. In contrast, a portion between the lattice patterns may be black, so that the portion between the lattice patterns may be represented as the low value on the histogram. That is, the measuring unit 130 may measure grey levels of the image along the X-direction and the Y-direction and then display the measured grey levels on the histogram.

In contrast, when the mask pattern may include the linear pattern, a portion in lines of the linear pattern may be white, so that the lines of the linear pattern may be represented as the peak on the histogram. In contrast, a portion between the lines of the linear patterns may be black, so that the portion between the lines of the linear patterns may be represented as the low value on the histogram. That is, the measuring unit 130 may measure grey levels of the image along a lengthwise direction of the lines and then display the measured grey levels on the histogram. Further, in order to detect a protruded portion of the linear pattern, the measuring unit 130 may measure widths of the lines in the linear pattern by a uniform pixel.

The determining unit 140 may analyze the histogram to determine whether defects such as a bridge, a total shift, a partial shift, etc., may exist or not in the mask pattern.

For example, the portion between the lattice patterns may be black. When the bridge may not exist in the portion between the lattice patterns, a line may be shown on a portion of the histogram corresponding to the portion between the lattice patterns. However, when the bridge may exist in the portion between the lattice patterns, a peak may be shown on the portion of the histogram corresponding to the portion between the lattice patterns. Thus, the determining unit 140 may analyze the peak on the histogram to determine existence of the bridge in the lattice pattern.

Further, the portion between the linear patterns may be black. When a gap between the linear patterns may be uniform, a gap between the peaks on the histogram may also be uniform. However, when any one of the linear patterns may be totally shifted, a gap between the shifted linear pattern and an adjacent linear pattern may be different from a gap between other linear patterns. Thus, the determining unit 140 may analyze the gap between the linear patterns to determine a shift of the linear pattern.

Furthermore, any one of the linear patterns may be partially shifted, not total shifted. In order to detect the partially shifted linear pattern, the measuring unit 130 may measure the widths of the linear patterns by a uniform pixel. When the linear pattern may not be partially shifted, the measured widths of the linear patterns may be uniform. However, when the linear pattern may be partially shifted, a width of a partially shifted portion in the linear pattern may be different from a width of a non-shifted portion in the linear pattern. When a width difference between the partially shifted portion and the non-shifted portion may be beyond an allowable range, the determining unit 140 may determine the linear pattern to be partially shifted.

Method of Inspecting a Mask

Figure 2:
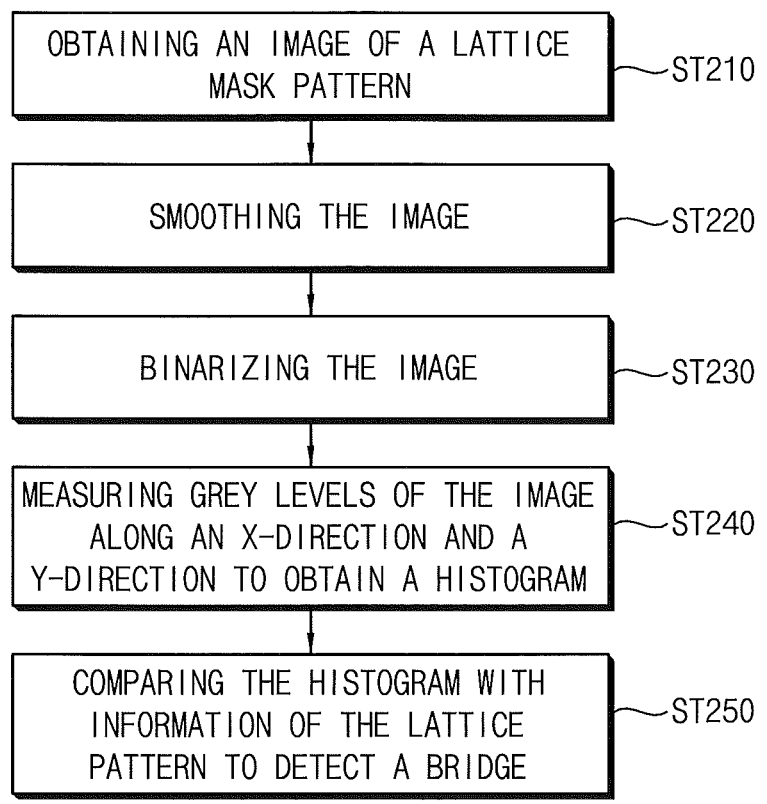
Figure 3:
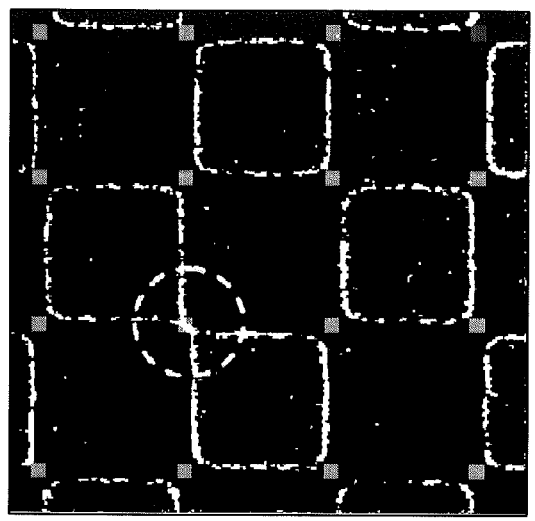
Figure 4:
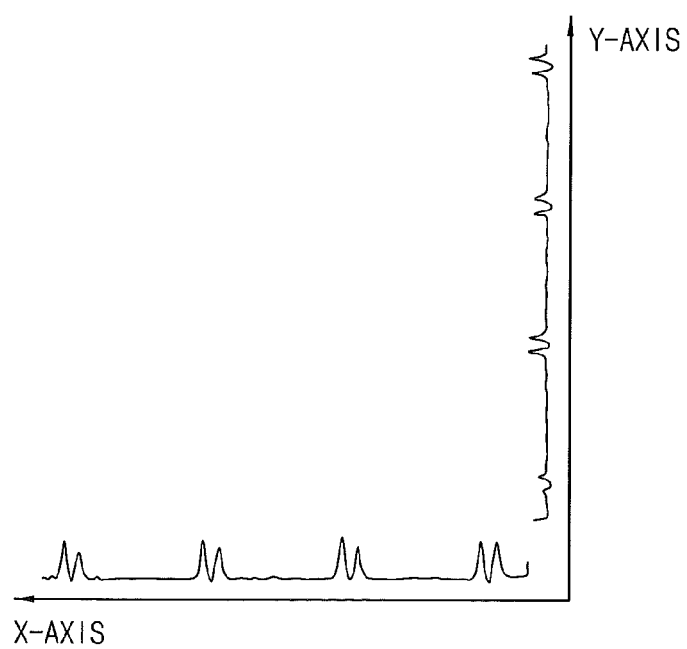

FIG. 2 is a flow chart illustrating a method of inspecting a lattice mask pattern using the apparatus in FIG. 1, FIG. 3 is an image of the lattice mask pattern obtained using an image-obtaining unit of the apparatus in FIG. 1, and FIG. 4 is a histogram obtained from the image.

Referring to FIGS. 1 and 2, in step ST210, the image-obtaining unit 110 may obtain an image of a lattice mask pattern. In some example embodiments, the image may include an SEM picture.

In step ST220, the smoothing unit 122 may smooth the image to remove noises from the image.

In step ST230, the binarizing unit 124 may binarize the smoothed image to obtain an image having a white color and a black color in FIG. 3. In FIG. 3, white portions may correspond to lines of the lattice pattern. In contrast, black portions may correspond to portions surrounded by lines of the lattice pattern and portions between the lines of the lattice pattern.

In step ST240, the measuring unit 130 may measure grey levels of the binarized image along an X-direction and a Y-direction to obtain a histogram in FIG. 4. In FIG. 4, peaked portion may correspond to the white portions of the image. In contrast, linear portions may correspond to the black portions of the image.

In step ST250, the determining unit 140 may compare the histogram with information of the lattice pattern to detect a bridge of the lattice pattern. In some example embodiments, the information of the lattice pattern may include a size of the lattice pattern, a gap between the lattice patterns, etc. Thus, when the bridge may not exist in the lattice pattern, the peaks on the histogram may coincide with the information of the lattice pattern.

However, when the bridge may exist in the lattice pattern, a peak, which may not coincide with the information of the lattice pattern, may be displayed on the histogram. The determining unit 140 may determine the peak discrepant with the information of the lattice pattern as the bridge of the lattice pattern.

In some example embodiments, the peaks discrepant with the information of the lattice pattern may be displayed along the X-direction and the Y-direction, so that an intersection between lines connected between the peaks may correspond to a position of the bridge. Therefore, the position of the bridge on the lattice pattern may be accurately detected. Because the bridge may be caused by a defect of an electron beam irradiating equipment, a position of the defect in the abnormal electron beam irradiating equipment corresponding to the position of the bridge may also be precisely detected. As a result, the defected portion of the electron beam irradiating equipment may be readily repaired.

Figure 5:
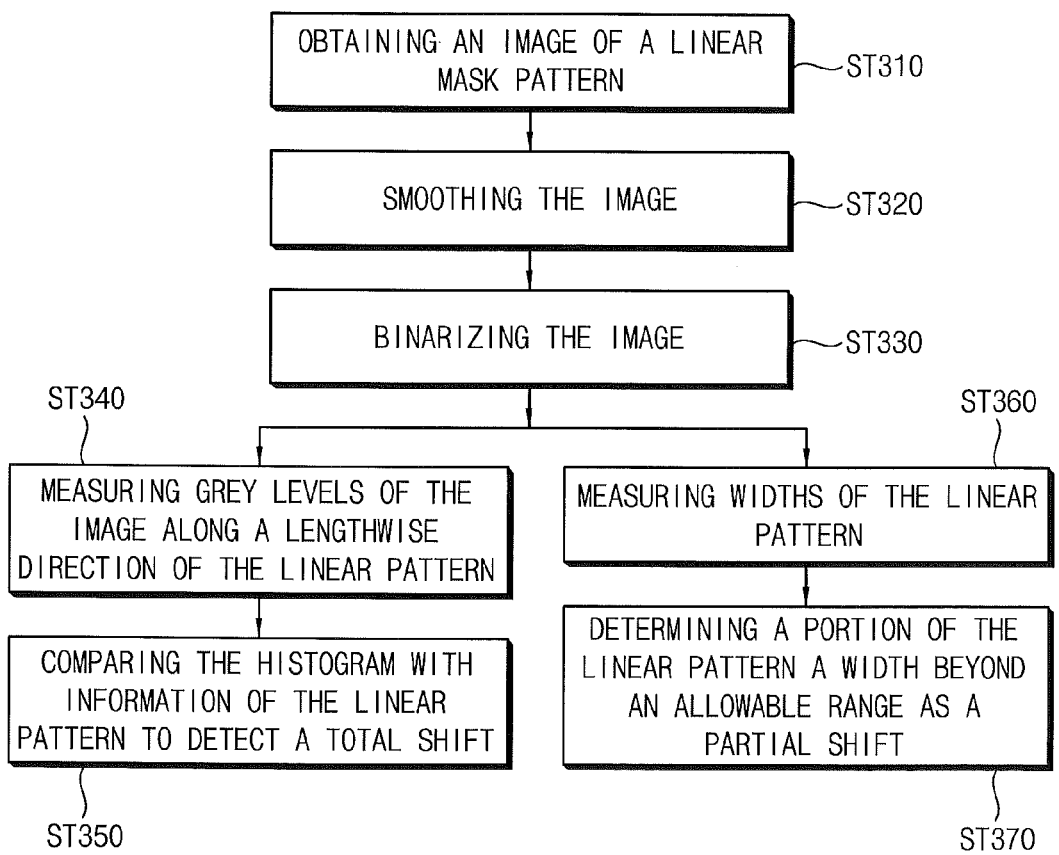
Figure 6:
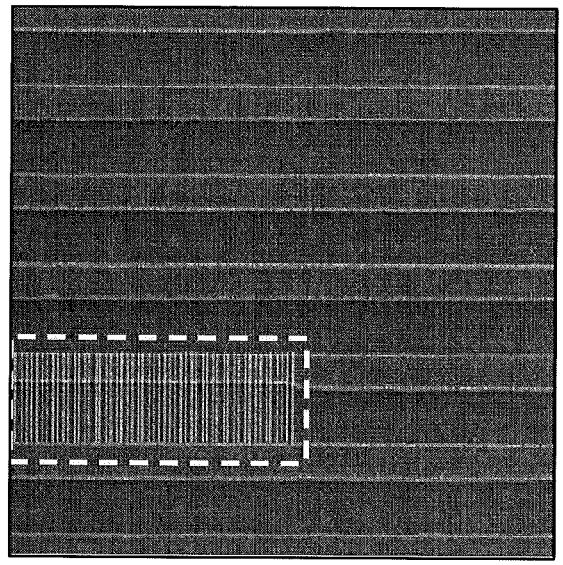

FIG. 5 is a flow chart illustrating a method of inspecting a linear mask pattern using the apparatus in FIG. 1, and FIG. 6 is an image of the linear mask pattern obtained using the image-obtaining unit of the apparatus in FIG. 1.

Referring to FIGS. 1 and 5, in step ST310, the image-obtaining unit 110 may obtain an image of a linear mask pattern. In some example embodiments, the image may include an SEM picture.

In step ST320, the smoothing unit 122 may smooth the image to remove noises from the image.

In step ST330, the binarizing unit 124 may binarize the smoothed image to obtain an image having a white color and a black color in FIG. 6. In FIG. 6, white portions may correspond to lines of the linear pattern. In contrast, black portions may correspond to portions between the lines of the linear pattern.

Figure 7:
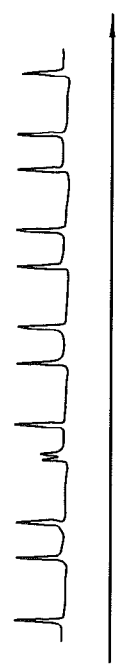
FIG. 7 is a histogram obtained from the image in FIG. 6.

In step ST340, the measuring unit 130 may measure grey levels of the binarized image along a lengthwise direction of the linear pattern to obtain a histogram in FIG. 6. In FIG. 6, peaked portion may correspond to the white portions of the image, as shown for example in the histogram in FIG. 7 obtained from the image in FIG. 6. In contrast, linear portions may correspond to the black portions of the image.

In step ST350, the determining unit 140 may compare the histogram with information of the linear pattern to detect a shift of the linear pattern. In some example embodiments, the information of the linear pattern may include a width of the linear pattern, a gap between the linear patterns, etc. Thus, when the linear pattern may not be shifted, the gaps between the linear patterns on the histogram may be uniform.

However, when the any one of the linear patterns may be totally shifted, a width of the shifted linear pattern may be different from a width of a non-shifted linear pattern. The determining unit 140 may determine the linear pattern having the width different from that of the non-shifted linear pattern as the shift.

Further, the linear pattern may be partially shifted, not totally shifted. This partial shift may not be accurately detected by measuring the widths of the linear patterns.

In order to detect the partial shift of the linear pattern, in step ST360, the measuring unit 140 may measure the widths of the linear patterns by a uniform pixel. When the linear patterns may not be partially shifted, the measured widths of the linear patterns may be uniform.

However, when the linear pattern may be partially shifted, a shifted portion of the linear pattern may have a width different from that of a non-shifted portion of the linear pattern. When a width difference between the shifted portion and the non-shifted portion of the linear pattern may be beyond an allowable range, the determining unit may determine the portion of the linear pattern as the partial shift.

In some example embodiments, the total shift or the partial shift may be caused by a defect of an electron beam irradiating equipment, a position of the defect in the abnormal electron beam irradiating equipment corresponding to the position of the total shift or the partial shift of the linear pattern may be precisely detected. As a result, the defected portion of the electron beam irradiating equipment may be readily repaired.

According to these example embodiments, the defects such as the bridge or the shift may be detected using the histogram obtained from the image of the pattern on the mask. Thus, reliability of defect detection in the mask may be remarkably improved. As a result, defects of an electron beam irradiating apparatus used for manufacturing the mask may be accurately detected.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of inspecting a mask, the method comprising:
   obtaining an image of a linear pattern on the mask;
   obtaining a histogram on which grey levels of the image are displayed; and
   comparing the histogram with information of the linear pattern to detect a defect of the mask, wherein obtaining the histogram comprises:
   measuring grey levels of the linear pattern along a lengthwise direction of the linear pattern; and
   measuring widths of the grey levels, wherein comparing the histogram with the information comprises determining a portion on the histogram discrepant with the information as a shift in the linear pattern.

2. The method of claim 1, further comprising removing noises from the image.

3. The method of claim 2, wherein removing the noises comprises:
   smoothing the image;
   binarizing the smoothed image.

4. The method of claim 1, further comprising:
   measuring widths of the linear patterns; and
   determining a portion of the linear pattern having a width beyond an allowable range as a partial shift of the linear.

\* \* \* \* \*